(12) United States Patent
Kang

(10) Patent No.: US 6,317,380 B1
(45) Date of Patent: Nov. 13, 2001

(54) CIRCUIT FOR DRIVING NONVOLATILE FERROELECTRIC MEMORY

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/633,123

(22) Filed: Aug. 4, 2000

(30) Foreign Application Priority Data

Aug. 16, 1999 (KR) .................................................. 99-33705

(51) Int. Cl.$^7$ ...................................................... G11C 8/00
(52) U.S. Cl. ............... 365/230.06; 365/145; 365/185.23; 365/189.04
(58) Field of Search .......................... 365/230.06, 230.03, 365/185.23, 189.04, 145

(56) References Cited

U.S. PATENT DOCUMENTS

| | | | |
|---|---|---|---|
| 4,873,664 | 10/1989 | Eaton, Jr. ............................. | 365/145 |
| 5,680,344 | 10/1997 | Seyyedy ............................... | 365/145 |
| 5,774,413 | * | 6/1998 | Hunt ................................... 465/230.06 |
| 5,848,000 | * | 12/1998 | Lee et al. .......................... 365/185.23 |
| 5,940,343 | * | 8/1999 | Cha et al. ......................... 365/230.06 |
| 5,986,938 | * | 11/1999 | Jang ................................. 365/185.23 |
| 6,021,088 | * | 2/2000 | Kim ................................. 365/230.06 |

* cited by examiner

*Primary Examiner*—Son T. Dinh
(74) *Attorney, Agent, or Firm*—Fleshner & Kim, LLP

(57) ABSTRACT

Circuit for driving a nonvolatile ferroelectric memory including a first cell array unit and a second cell array unit each having a plurality of cell arrays, a first local wordline driver unit having a plurality of local wordline drivers formed on one side of the first cell array unit for providing signals for driving any of the cells in the first cell array unit, a second local wordline driver unit having a plurality of local wordline drivers formed on one side of the first local wordline driver unit for providing signals for driving any of the cells in the second cell array unit, a main wordline driver for providing a control signal for enabling either one of the first local wordline driver unit and the second wordline driver unit, and a local X decoder unit for providing driving signals to be provided to the first and second split wordlines corresponding to certain cells to the first and second local wordline driver units, whereby minimizing a chip size and maximizing a device driving capability by utilizing a layout effectively.

18 Claims, 15 Drawing Sheets

CIRCUIT FOR DRIVING NONVOLATILE FERROELECTRIC MEMORY

BACKGROUND OF THE INVENTION

1. Field of the Invention

The present invention relates to a semiconductor memory device, and more particularly, to a circuit for driving a nonvolatile ferroelectric memory.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 illustrates a block diagram of a related art nonvolatile ferroelectric memory. As shown in FIG. 4, the related art nonvolatile ferroelectric memory is provided with a main wordline driver 41, a first cell array 43 on one side of the main wordline driver 41, a first local wordline driver 45 on one side of the first cell array 43, a second local wordline driver 47 on one side of the first local wordline driver 45 and a second cell array 49 on one side of the second local wordline driver 47. A first local X decoder 51 is formed over the first local wordline driver 45, and a second local X decoder 53 formed over the second local wordline driver 47. The first local wordline driver 45 is adapted to receive a signal from the main wordline driver 41 and a signal from the first local X decoder 51 and selects a wordline for the first cell array unit 43. The second local wordline driver 47 is adapted to receive a signal from the main wordline driver 41 and a signal from the second local X decoder 53 and selects a wordline for the second cell array 49. The related art nonvolatile ferroelectric memory provides a signal from the main wordline driver 41 both to the first and second local wordline drivers 45 and 47. Therefore, one of the first and second cell arrays 43 and 49 is selected depending on signals from the first local X decoder 51 and the second local X decoder 53. That is, either the first cell array 43 or the second cell array 49 is selected, and a wordline of the selected cell array is driven depending on signals from the first and second local X decoders 51 and 53.

FIG. 5 is a diagram that illustrates selection of one of the cell arrays depending on signals from the first and second local X decoders 51, 53 of FIG. 4. As shown in FIG. 5, the main wordline connected to the main wordline driver 41 is formed across the first and second local wordline drivers 45 and 47 and the first and second cell arrays 43 and 49. The first local wordline driver 45 is a NAND logic gate 55 for subjecting a signal from the main wordline driver 41 received through the main wordline and a signal from the first local X decoder 51 to an logical operation. An output of the logic gate 55, the NAND gate, is dependent on signals from the first and second local X decoders 51 and 53 regardless of the signal provided from the main wordline driver 41. For example, if it is assumed that a high signal is provided from the main wordline driver 41, the first cell array 43 is selected if a signal from the first local X decoder 51 is low and a signal from the second local X decoder 53 is high. Opposite to this, if a signal from the first local X decoder 51 is high and a signal from the second local X decoder 53 is low, the second cell array 49 is selected. Thus, selection of either of the first and second cell arrays is dependent on the signals from the first and second local X decoders 51 and 53. As described above, the circuits for driving a nonvolatile ferroelectric memory shown in FIGS. 4 and 5 are limited portions. Thus, there are a plurality of first and second local wordline drivers 45 and 47, the first and second cell arrays 43 and 49, and first and second local X decoders 51 and 53.

As described above, the related art circuit for driving a nonvolatile ferroelectric memory has various disadvantages. The two local X decoders required for selection of either one of the left or right cell array occupy a large area. Such an area increase, even if the area should become smaller according to the trend of high density device packing, causes delays that drop an access speed and deteriorate a driving performance. Further, an increase in chip size is not favorable for device packing or cost.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a circuit for driving a memory that substantially obviates one or more problems due to limitations and disadvantages of the related art.

Another object of the present invention is to provide a circuit for driving a nonvolatile ferroelectric memory that can reduce a chip size.

Another object of the present invention is to provide a circuit for driving a nonvolatile ferroelectric memory that can increase a device driving capability.

Another object of the present invention is to provide a circuit for driving a nonvolatile ferroelectric memory that can reduce a device size and increase a device driving capability.

To achieve at least these objects and other advantages in a whole or in part and in accordance with the purpose of the present invention, as embodied and broadly described, a circuit that drives a nonvolatile ferroelectric memory includes a first cell array unit and a second cell array unit each having a plurality of cell arrays, a first local wordline driver unit having a plurality of local wordline drivers on one side of the first cell array unit that provides signals for driving any of the cells in the first cell array unit, a second local wordline driver unit having a plurality of local wordline drivers on one side of the second cell array unit that provides signals for driving any of the cells in the second cell array unit, a main wordline driver that provides a control signal for enabling either one of the first local wordline driver unit and the second wordline driver unit, and a local X decoder unit that provides driving signals to be provided to the first and second split wordlines corresponding to selected cells of the first and second local wordline driver units.

To further achieve the above objects of the present invention in a whole or in parts, there is provided a memory device that includes a first memory array and a second memory array each having a plurality of cell arrays, a first local wordline driver unit having a first plurality of local wordline drivers on one side of the first memory array that provides driving signals for cells in the first memory array, a second local wordline driver unit having a second plurality of local wordline drivers on one side of the first local wordline driver unit that provides driving signals for cells in the second memory array, a main wordline driver that provides a control signal to enable one of the first local wordline driver unit and the second local wordline driver unit and a decoder that provides the driving signals to the first and second local wordline driver units for selected cells in the first and second memory arrays.

To further achieve the above objects of the present invention in a whole or in parts, there is provided a nonvolatile ferroelectric memory that includes a first cell array and a second cell array each having a plurality of cell subarrays, each cell subarray including 'n' number of split wordline pairs in a first direction, 'm' number of bitlines in a second direction that cross the split wordline pairs, and a cell having a transistor and a ferroelectric capacitor where each bitline crosses each split wordline pair, wherein 'n' and 'm' are positive integers, a first local wordline driver circuit adjacent the first cell array unit that provides a driving signal to drive one pair of the 'n' number of split wordline pairs, a second local wordline driver circuit adjacent the first local wordline driver circuit that provides the driving signal to drive any one pair of the 'n' number of split wordline pairs in the second cell array, a main wordline driver that provides a control signal to enable one of the first local wordline driver circuit and the second wordline driver circuit and disable the other one of the first local wordline driver circuit and the second wordline driver circuit and a local decoder that provides driving signals for the 'n' number of split wordline pairs to both the first and second local wordline driver for driving selected cells.

To further achieve the above objects of the present invention in a whole or in parts, there is provided a driving circuit for a memory device that includes a main wordline driver outputting a plurality of control signals, a local decoder outputting a plurality of driving signals and a plurality of local wordline drivers, wherein each of the local wordline drivers includes a plurality of switches, a plurality of switches to a corresponding one of the first switches and a plurality of third switches coupled to a corresponding one of the second switches, wherein said each of the local wordline drivers drives a corresponding wordline responsive to the plurality of control signals and the plurality of driving signals.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
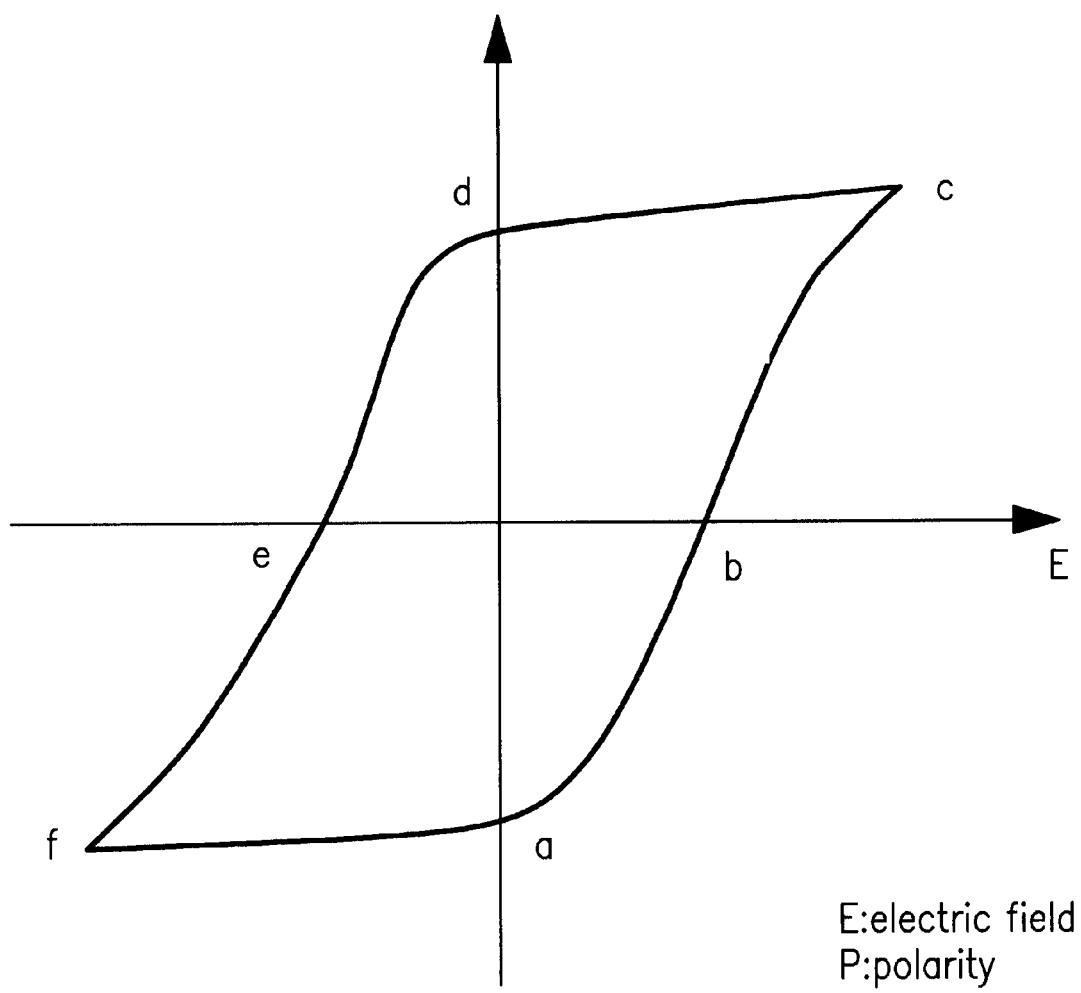
FIG. 1 illustrates a hysteresis loop of a ferroelectric material.
Figure 2:
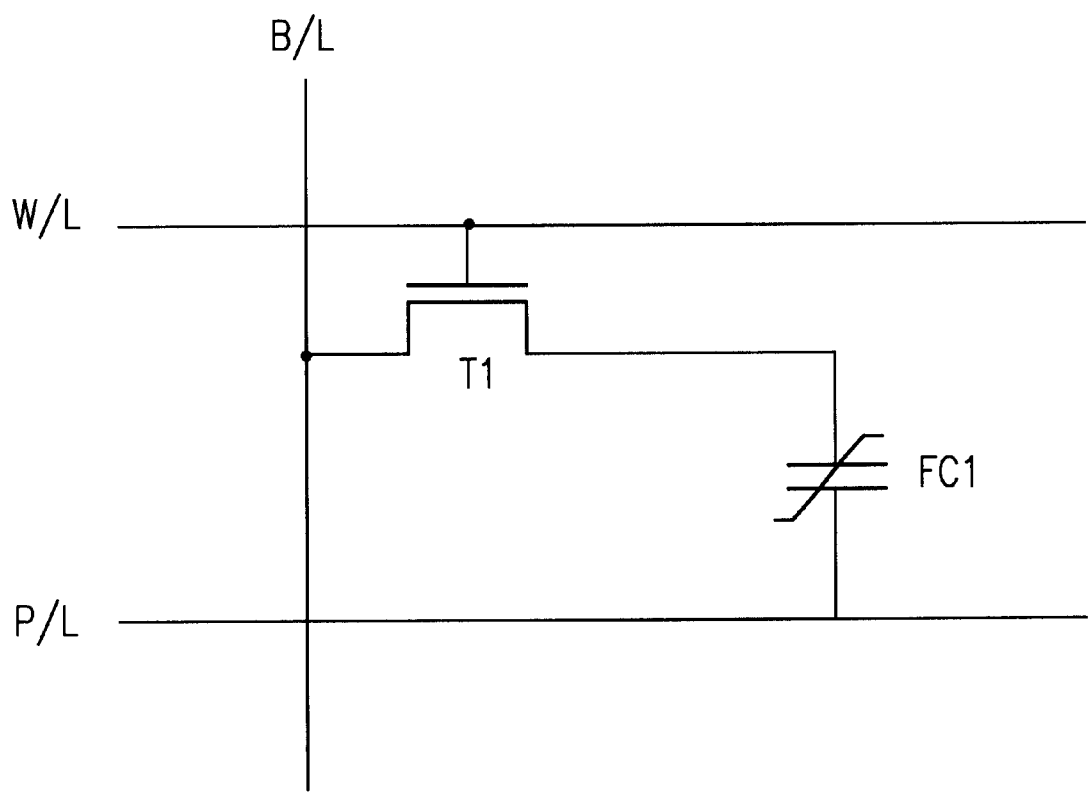
FIG. 2 is a schematic diagram that illustrates an unit cell of a related art non-volatile ferroelectric memory.
Figure 3A:
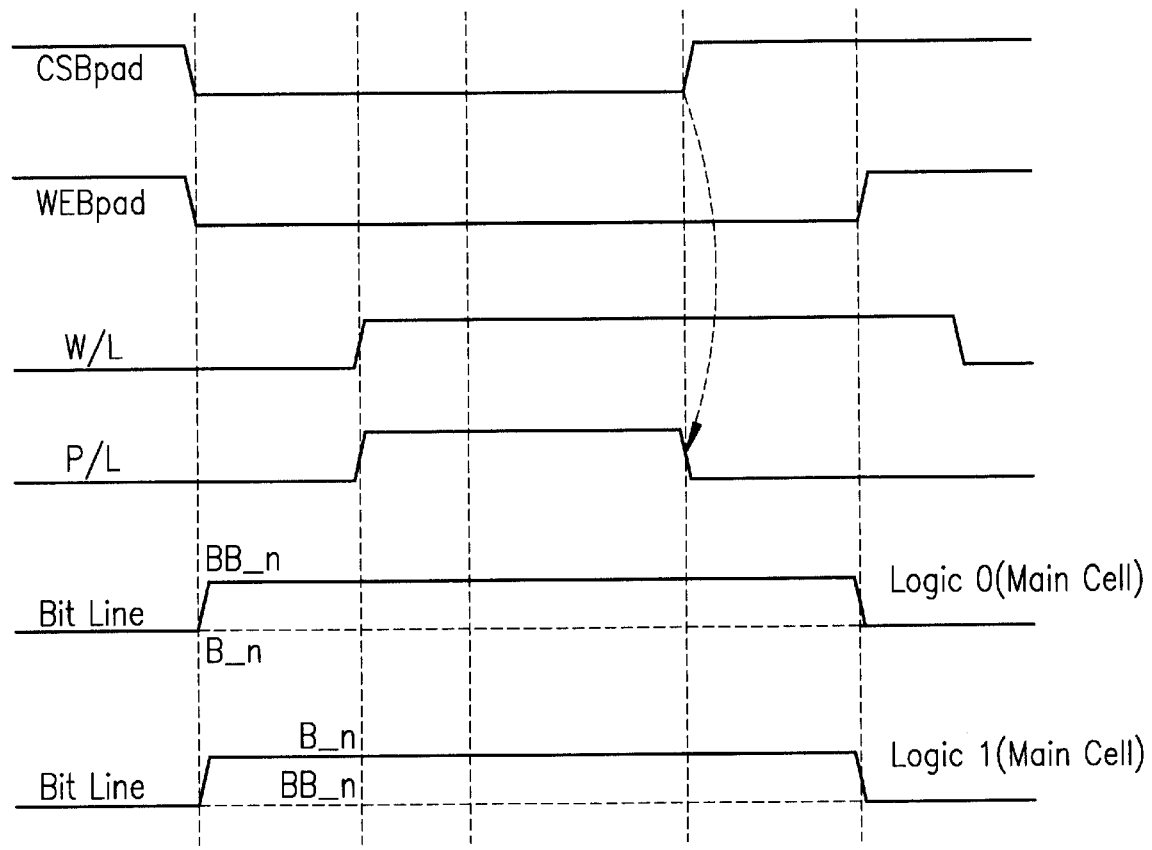
FIG. 3A illustrates a timing diagram of a write mode operation of the related art nonvolatile ferroelectric memory.
Figure 3B:
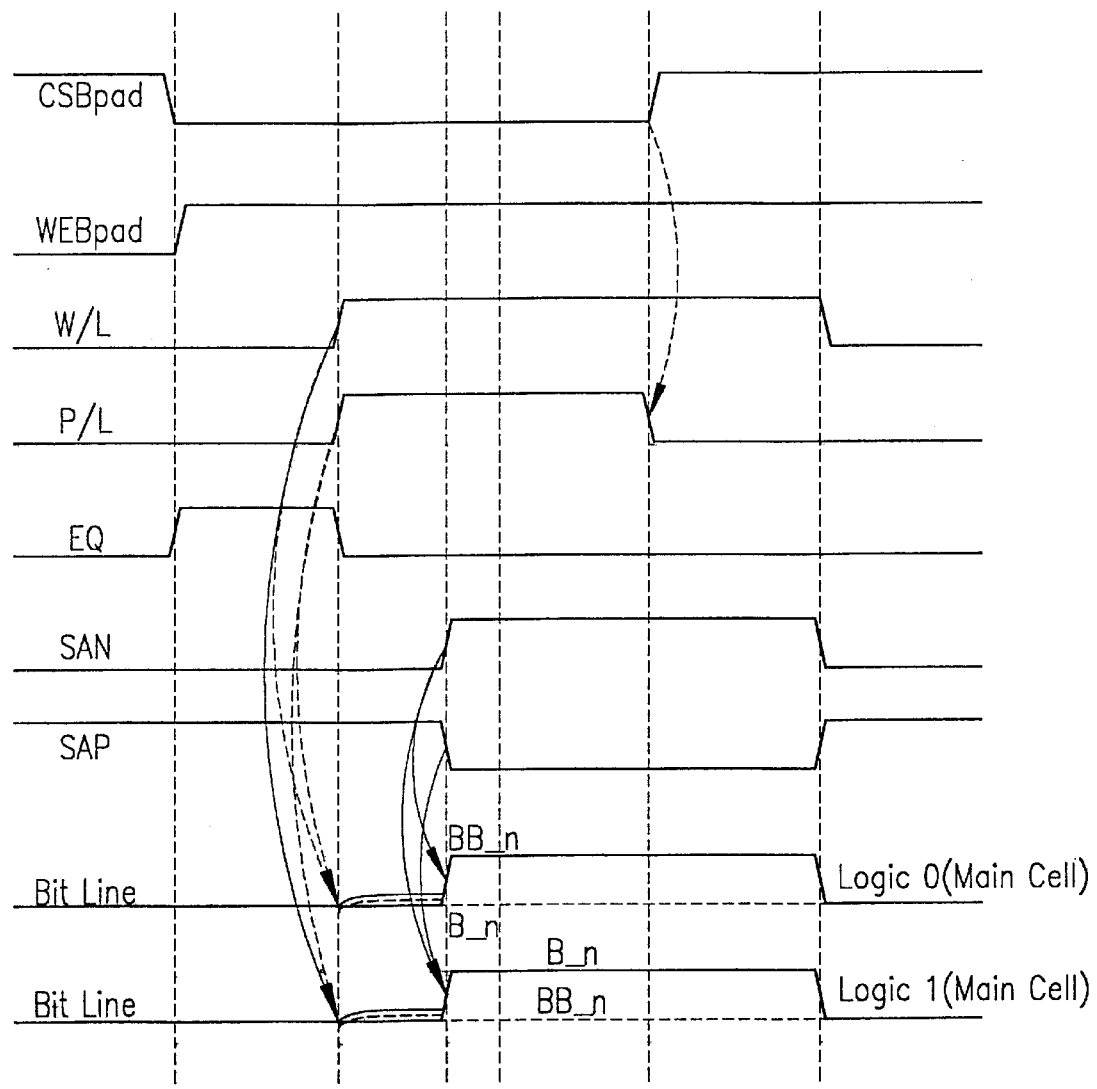
FIG. 3B illustrates a timing diagram of a read mode operation of the related art nonvolatile ferroelectric memory.
Figure 4:
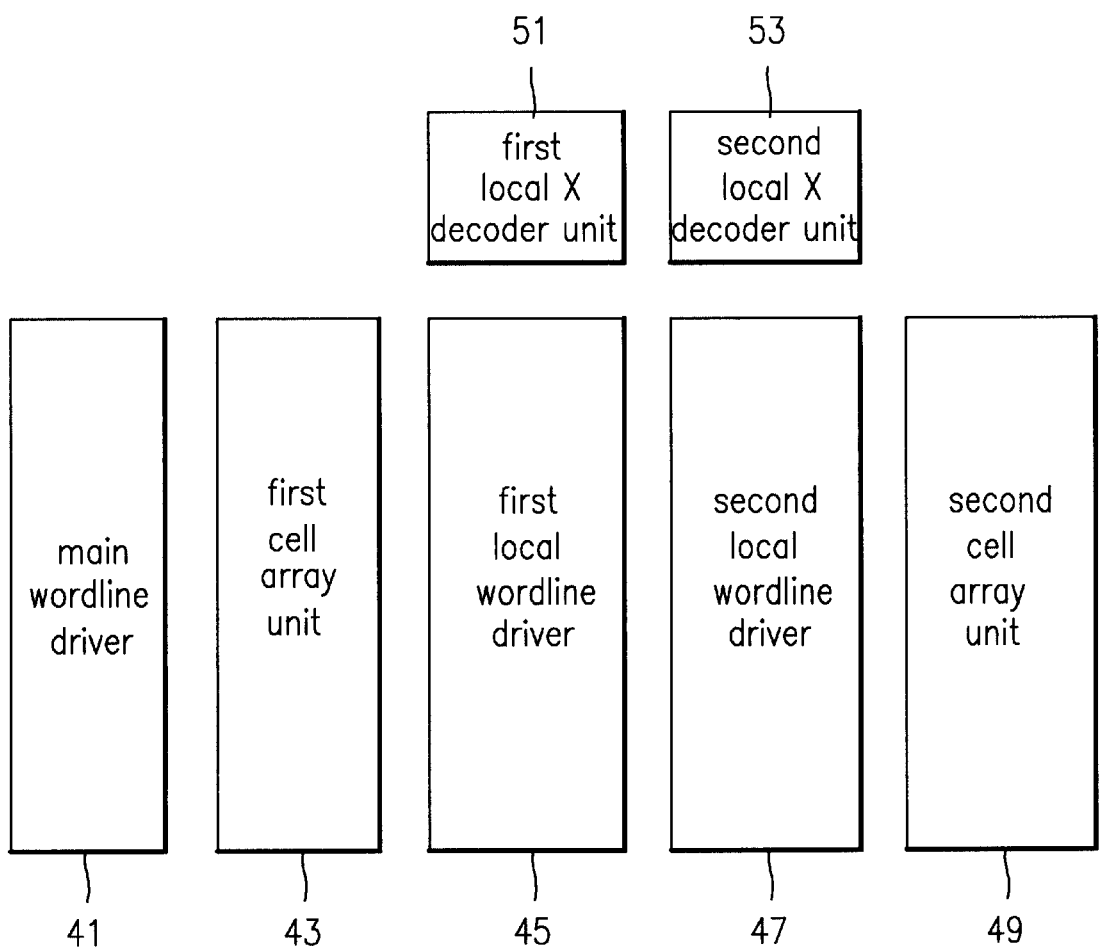
FIG. 4 illustrates a block diagram of a related art non-volatile ferroelectric memory.
Figure 5:
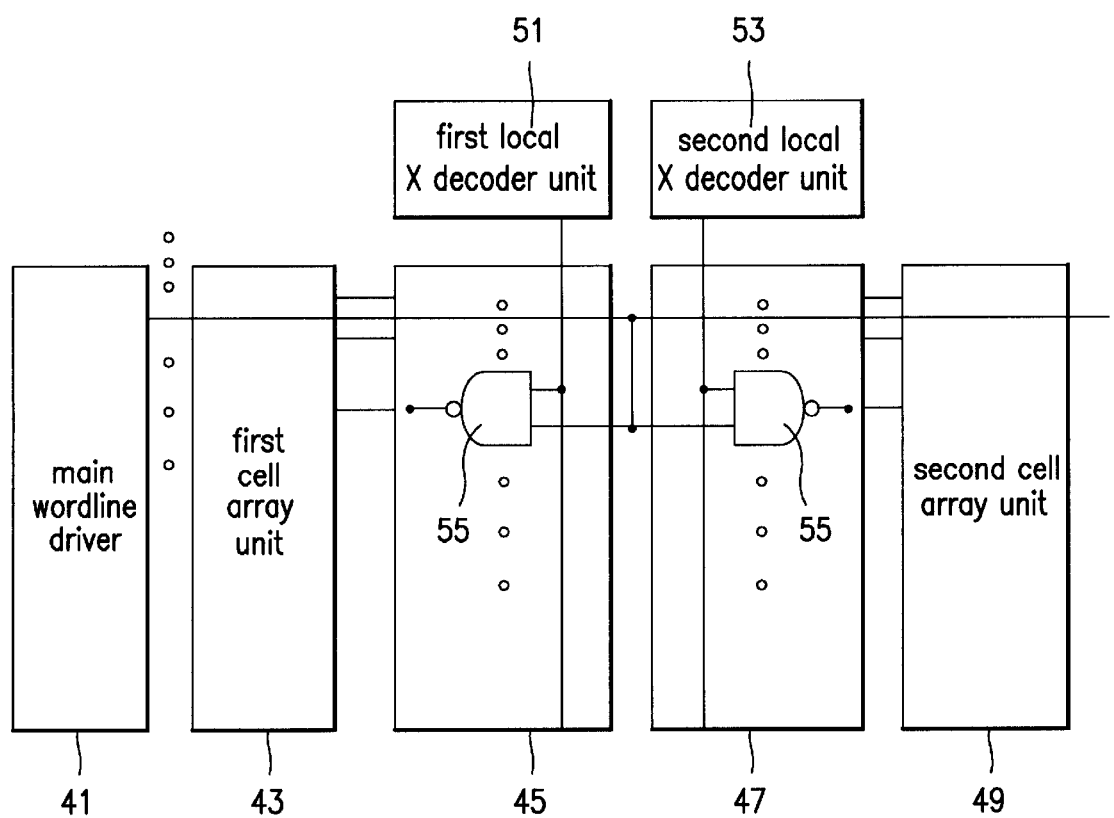
FIG. 5 illustrates a partial detail of a related art nonvolatile ferroelectric memory of FIG. 4.
Figure 6:
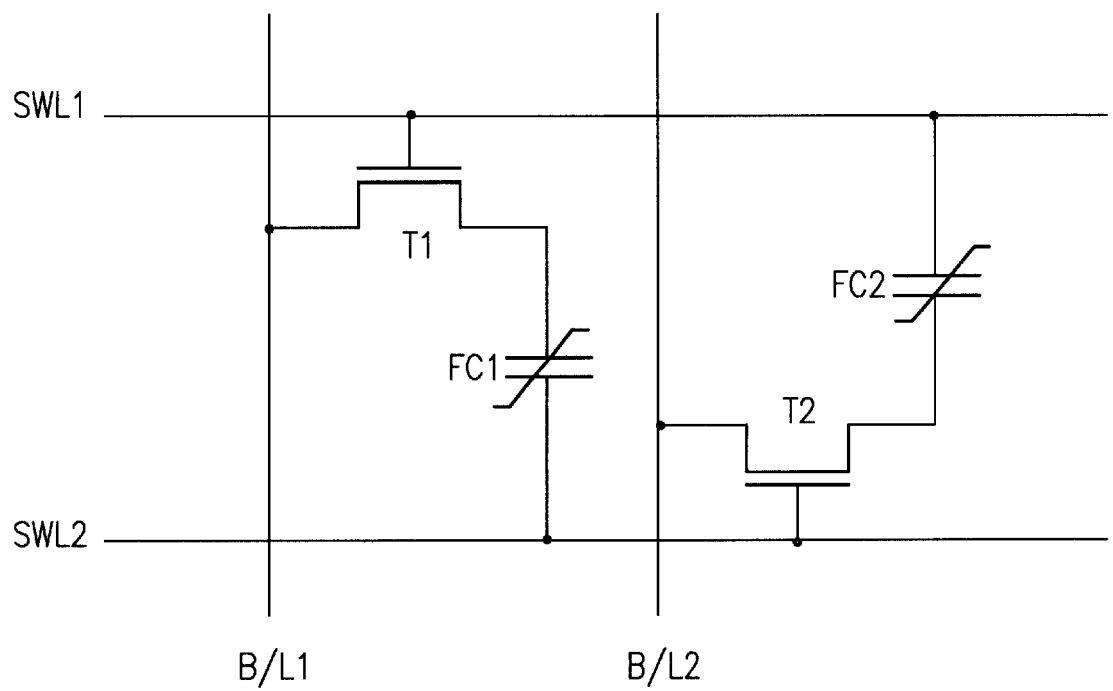
FIG. 6 is a diagram that illustrates a unit cell of a nonvolatile ferroelectric memory according to preferred embodiments of the present invention.

FIG. 6 is a schematic view showing a unit cell of a nonvolatile ferroelectric memory device according to preferred embodiments of the present invention. As shown in FIG. 6, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. A plurality of the unit cells make a cell array.

In view of data storage, the unit cell can include a pair of split wordlines, a bitline, a transistor 1T, and a ferroelectric capacitor 1C. The unit cell can also include a pair of split wordlines, two bitlines, two transistors 2Ts, and two ferroelectric capacitors 2FCs. In preferred embodiments according to the present invention, the unit cell of 2T/2C structure is used.

Figure 7:
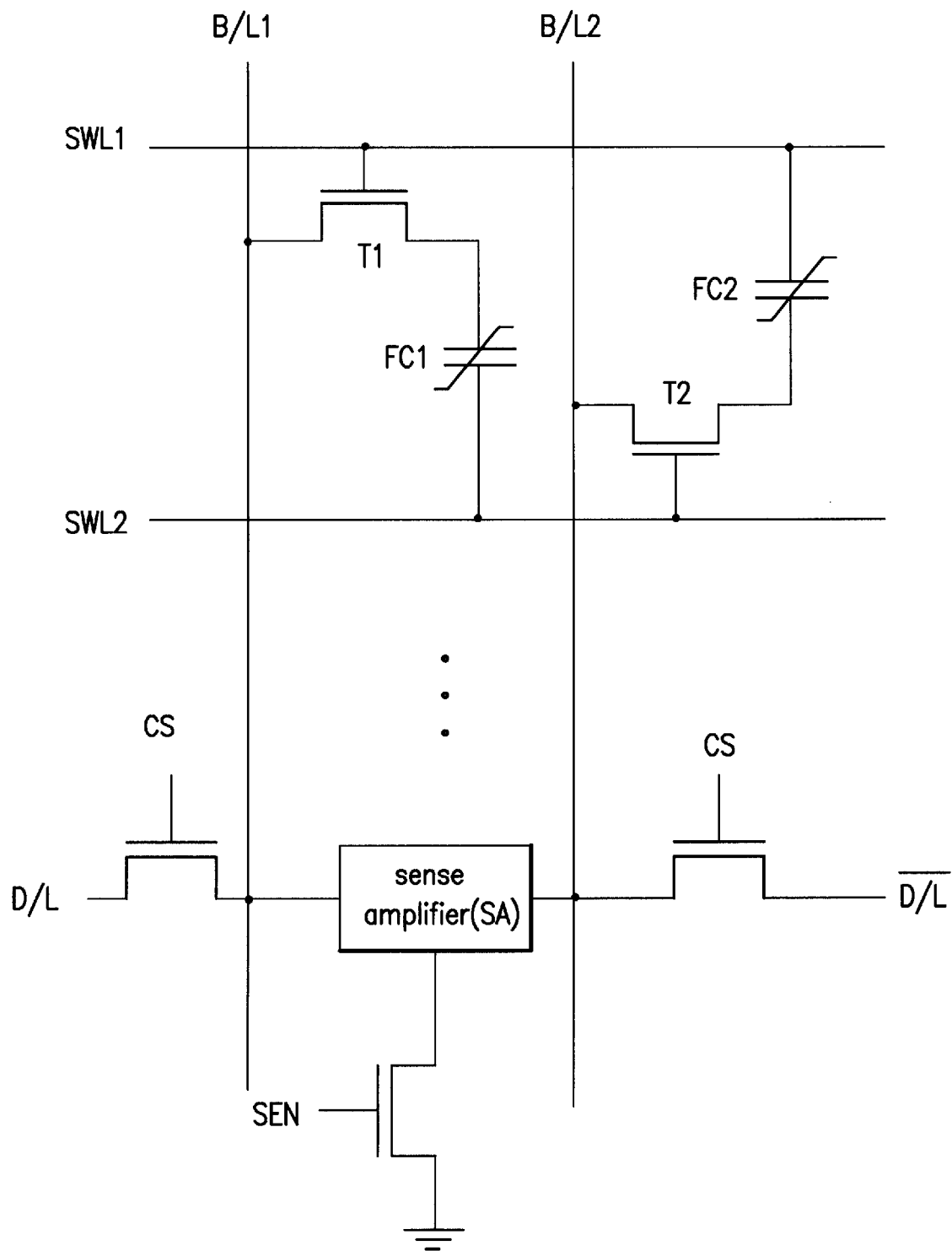
FIG. 7 is a circuit diagram that illustrates a non-volatile ferroelectric memory according to preferred embodiments of the present invention.

FIG. 7 is a circuit diagram showing portions of a non-volatile ferroelectric memory device according to preferred embodiments of the present invention. As shown in FIG. 7, a plurality of split wordline pairs each including first and second split wordlines SWL1 and SWL2 in pairs are preferably formed in row direction. A plurality of bitline pairs B/Ln and B/Ln+1 (e.g., B/L1 and B/L2) are formed across the split wordline pairs. Sensing amplifiers SA are formed between the respective bitline pairs to sense data transmitted through the bitlines and transfer the sensed data to a data line DL or a data bar line/DL. In addition, a sensing amplifier enable portion and a selection switching portion are provided. The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 8.

Figure 8:
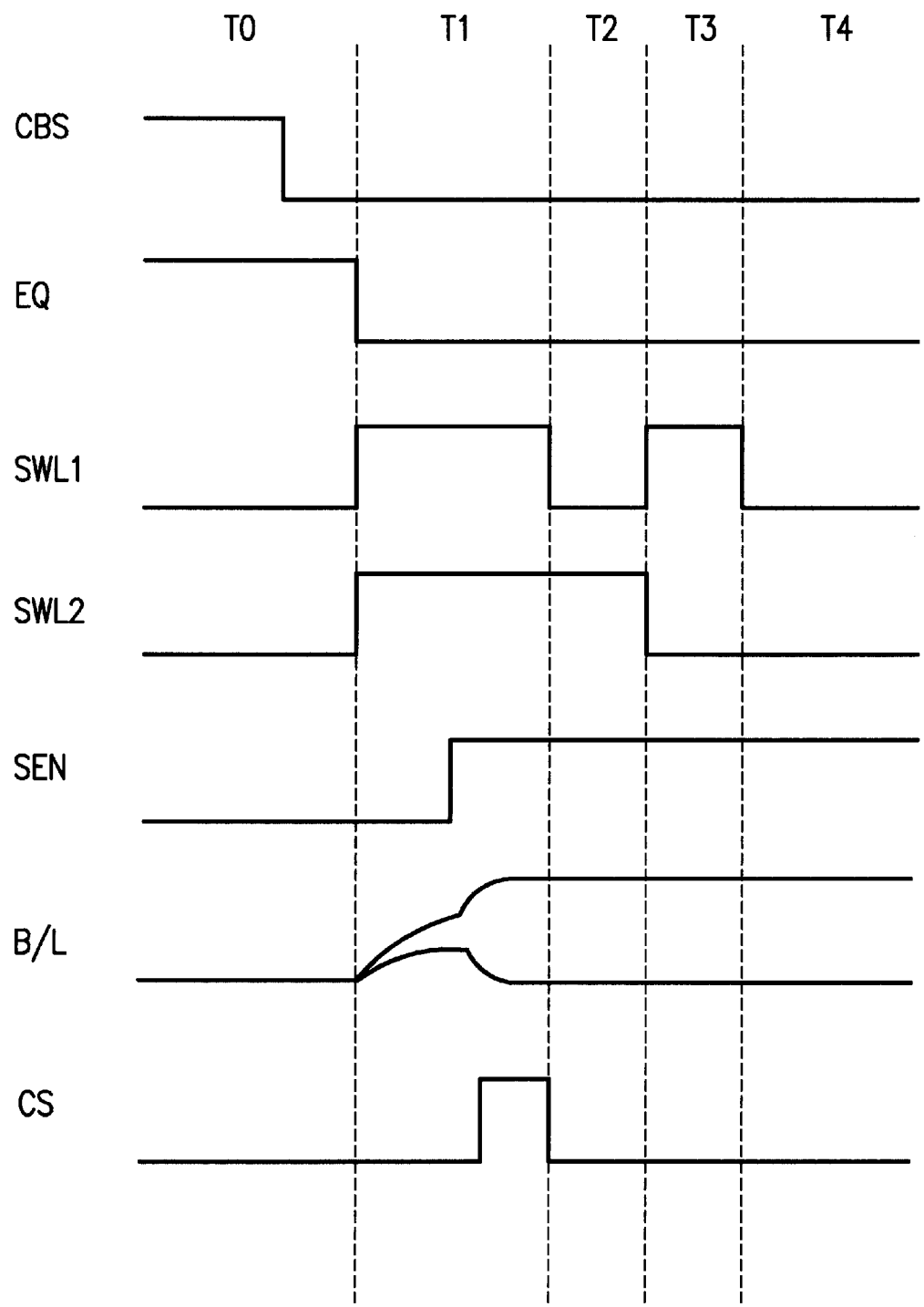
FIG. 8 illustrates a timing diagram showing operations of a nonvolatile ferroelectric memory according to preferred embodiments of the present invention.

A T0 period in FIG. 8 denotes a period before the first split wordline SWL1 and the second split wordline SWL2 are activated to "high (H)". In this T0 period, all of bitlines are preferably precharged at a level.

A T1 period denotes a period that the first and second split wordlines SWL1 and SWL2 are all to become high level "H". In this T1 period, data of the ferroelectric capacitor in the main cell are transmitted to a bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in later T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 9:
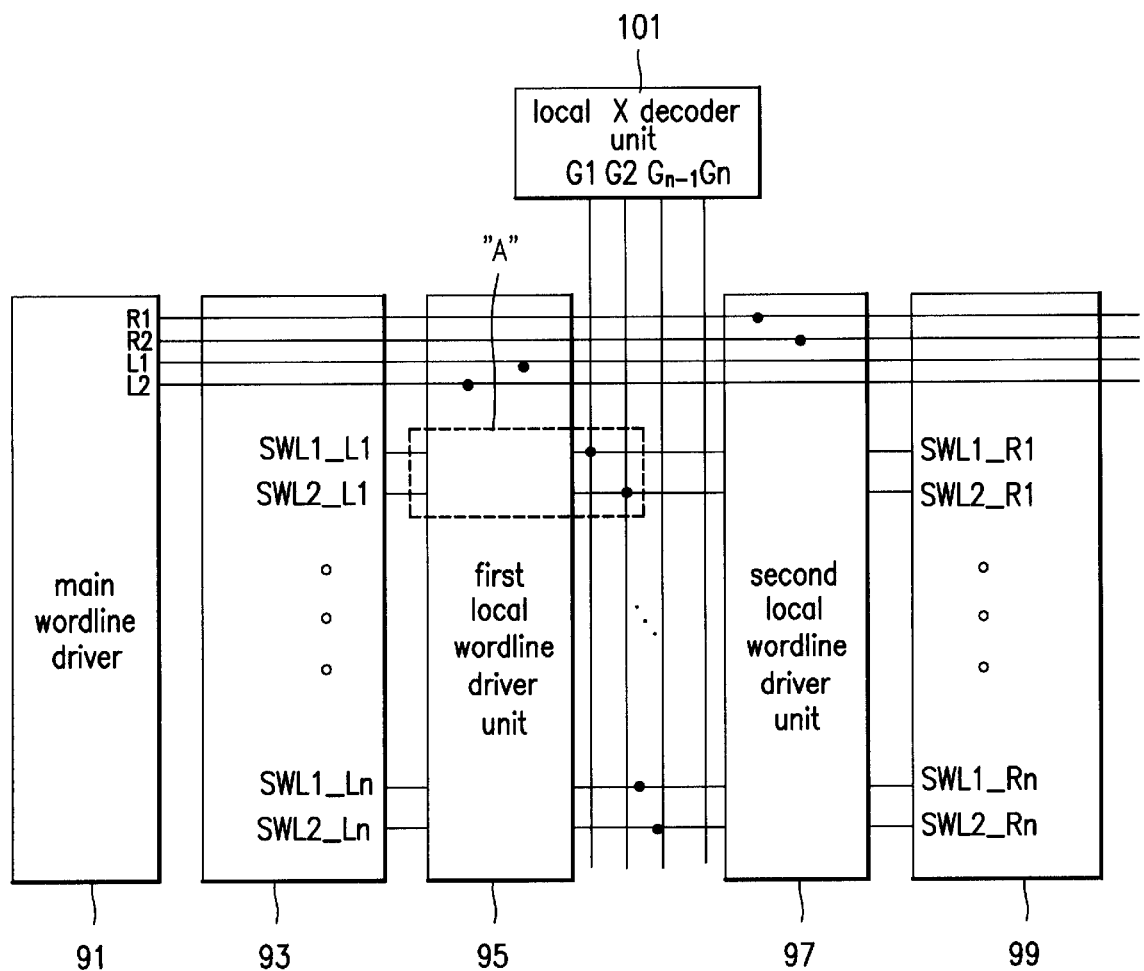
FIG. 9 illustrates a block diagram showing a preferred embodiment of a nonvolatile ferroelectric memory according to the present invention.

FIG. 9 illustrates a block diagram showing a first preferred embodiment of nonvolatile ferroelectric memory according to the present invention. As shown in FIG. 9, the first preferred embodiment of the nonvolatile ferroelectric memory of the present invention includes a main wordline driver 91, a first cell array unit 93 on one side of the main wordline driver 91 having a plurality of cell arrays, a first local wordline driver unit 95 on one side of the first cell array 93 having a plurality of local wordline drivers, a second local wordline driver unit 97 on one side of the first local wordline driver unit 95 having a plurality of local wordline drivers and a second cell array unit 99 on one side of the second local wordline driver unit 97 having a plurality of cell arrays. A local X decoder unit 101 is preferably formed over (or below) the first and second local wordline driver units 95 and 97. The main wordline driver 91 provides a first and a second control signals for enabling one of the first and second wordline driver units 95 or 97, and a third and a fourth control signals for disabling the other one. The enabling first and second control signals may be R1 or R2 or L1 or L2. That is, if the R1 and R2 are first and second control signals, the L1 and L2 are the third and fourth control signals. Alternately, if the L1 and L2 signals are the first and second control signals, the R1 and R2 are the third and fourth control signals. However, the present invention is not intended to be so limited.

When the first and second control signals are R1 and R2, respectively, the second local wordline driver unit 97 is preferably enabled. When the first and second control signals are L1 and L2, respectively, the first local wordline driver unit 95 is preferably enabled. The first and the second control signals preferably have opposite phases. However, the present invention is not intended to be so limited. Each of the first and second cell arrays 93 and 94 includes cell arrays each having a plurality of unit cells each with two transistors and two ferroelectric capacitors. The unit cell includes a first and a second split wordlines SWL1 and SWL2 (e.g., SWL1-L1, SWL2-L1, . . . , SWL1-Ln, SWL2-Ln) running in one direction spaced a distance from each other. A first and a second bitlines B/L1 and B/L2 (not shown) run in a direction crossing the first and second split wordlines spaced a distance from each other. A first transistor T1 (not shown) has a drain coupled to the first bitline and a gate coupled to the first split wordline, a first ferroelectric capacitor FC1 (not shown) is formed between a source of the first transistor and the second split wordline, a second transistor T2 (not shown) has a drain coupled to the second bitline and a gate coupled to the second split wordline, and a second ferroelectric capacitor FC2 (not shown) is formed between a source of the second transistor and the first split wordline.

The local X decoder unit 101 provides control signals corresponding to the split wordlines, and the control signals are also provided to the first and second local wordline driver units 95 and 97, too. The main wordline driver 91 provides a control signal for controlling the first local wordline driver unit 95 and the second local wordline driver unit 97. The main wordline driver 91 preferably provides a control signal for selecting either one of the first local wordline driver unit 95 and the second wordline driver unit 97. The local wordline driver selected by the control signal is preferably enabled to provide an enable signal from the local X decoder to a desired split wordline pair.

Figure 10A:
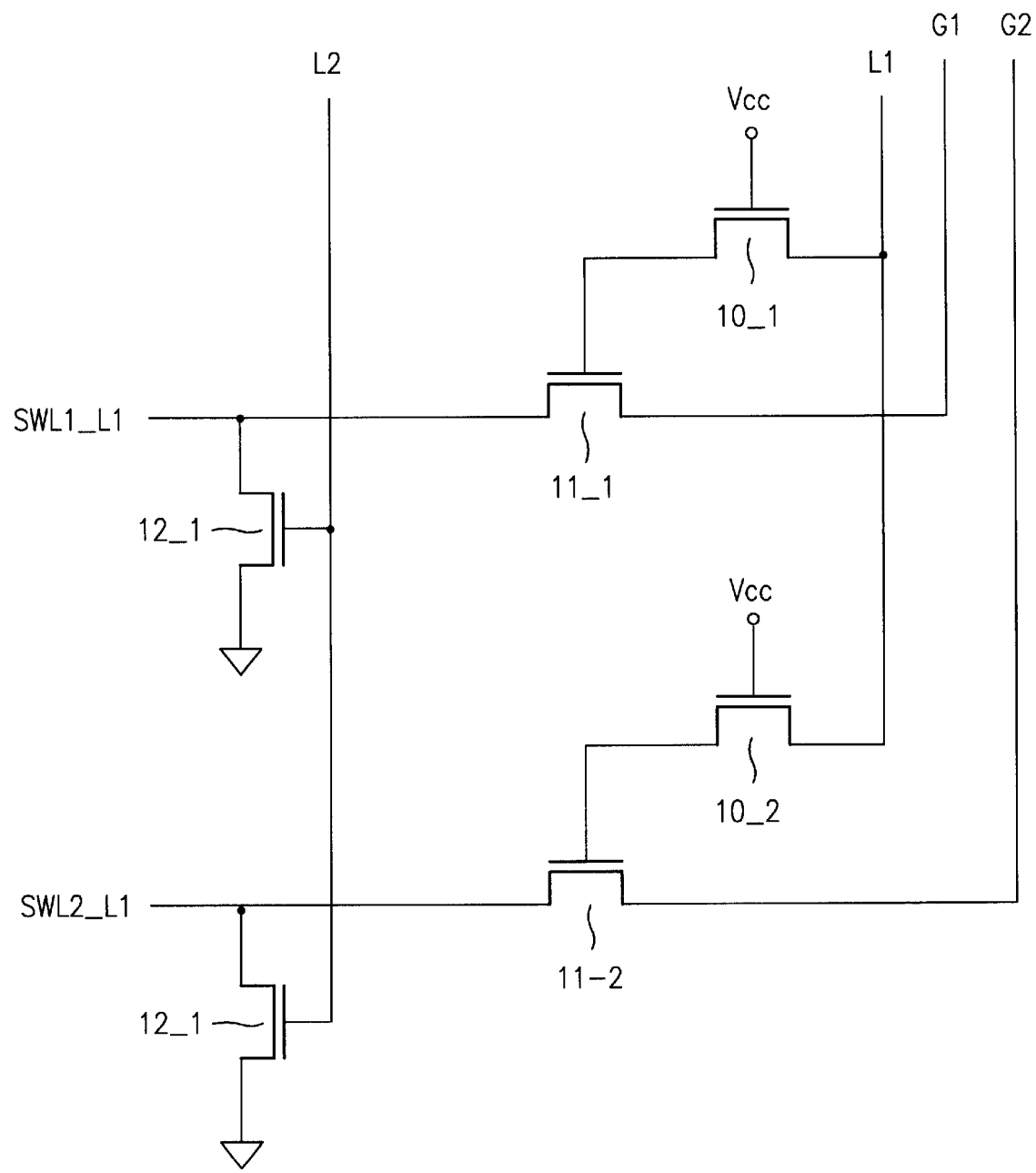
FIG. 10A is a diagram that illustrates additional detail of the nonvolatile ferroelectric memory of FIG. 9 according to the present invention.

FIG. 10A is a diagram that illustrates an "A" part in FIG. 9. As shown in FIG. 10A, there are first switching devices 10_1 and 10_2 for switching a first control signal L1, second switching devices 11_1 and 11_2 controlled by the first control signal L1 provided through the first switching devices for switching signals G1 and G2 from the local X decoder, and third switching devices 12_1 and 12_2 controlled by the second control signal L2 for providing signals G1 and G2 from the local X decoder received through the second switching devices 11_1 and 11_2 to the first split wordline SWL1_L1 and the second split wordline SWL2_L2. All the first, second and third switching devices are preferably NMOS transistors. However, the present invention is not intended to be so limited to NMOS transistor or two of each of the switching signals or first through third switching devices. The first control signal L1 and the second control signal L2, which are local wordline driver enable signals from the main wordline driver, preferably have opposite polarities.

Operations of a local wordline driver shown in FIG. 10A will now be described. When enabled, the first control signal L1 is at a high level and the second control signal L2 is at a low level. When disabled, the first control signal L1 is at a low level and the second control signal L2 is at a high level. Of the signals from the local X decoder 101, the G1 signal is at a high level when enabled, and if the L2 signal is at a low level in a state the L1 signal is at a high level, the first split wordline SWL1_L1 is enabled to a high level.

The first split wordline SWL_L1 may be disabled to a low level using, for example, two methods. The first method is a case when the G1 signal is at a low level under a state the L1 signal is at a high level and the L2 signal is at a low level. The second method is a case when the first split wordline SWL_L1 is disabled to a low level without prerequisite conditions (e.g., regardless of the G1 signal) when the L1 signal is at a low level and the L2 signal is at a high level.

Further, of the signals from the local X decoder 101, if the L2 signal is at a low level in a state the G2 signal is enable at a high level and the L1 signal is at a high level, the second split wordline SWL2_L1 is enabled to a high level. The second split wordline may be disabled in two methods. A first method is when the G2 signal is at a low level in a state the L1 signal is at a high level and the L2 signal is at a low level. The second method is when the second split wordline is disabled without prerequisite conditions (e.g., regardless of the G2 signal) when the L1 signal is at a low level and the L2 signal is at a high level.

Operations for selection of the cell array units by L1 and L2 will now be described with reference to FIG. 9 and FIG. 10A. Even if the G1 and G2 signals from the local X decoder 101 are commonly provided to the first local wordline driver unit 95 and the second local wordline driver unit 97, either one of the first and second local wordline driver units 95 and 97 are determined according to the first, second, third and fourth control signals. As described above, the first and second control signals are enable signals for enabling one of the first and second local wordline.drivers 95 and 97, and the third and fourth control signals are signals for disabling the other one. Therefore, if the L1 and L2 signals are the first and second control signals, the first local wordline driver unit is selected. For example, when it is intended to select any one unit cell in the first cell array unit 93, the L1 and L2 are brought into an enabled state, and the R1 and R2 are brought into a disabled state to transfer the first local wordline driver unit 95 into an enabled state. That is, the R1 signal should be brought to a low level, and the R2 signal should be brought to a high level in a state the L1 signal is at a high level and the L2 signal is at a low level.

Figure 10B:
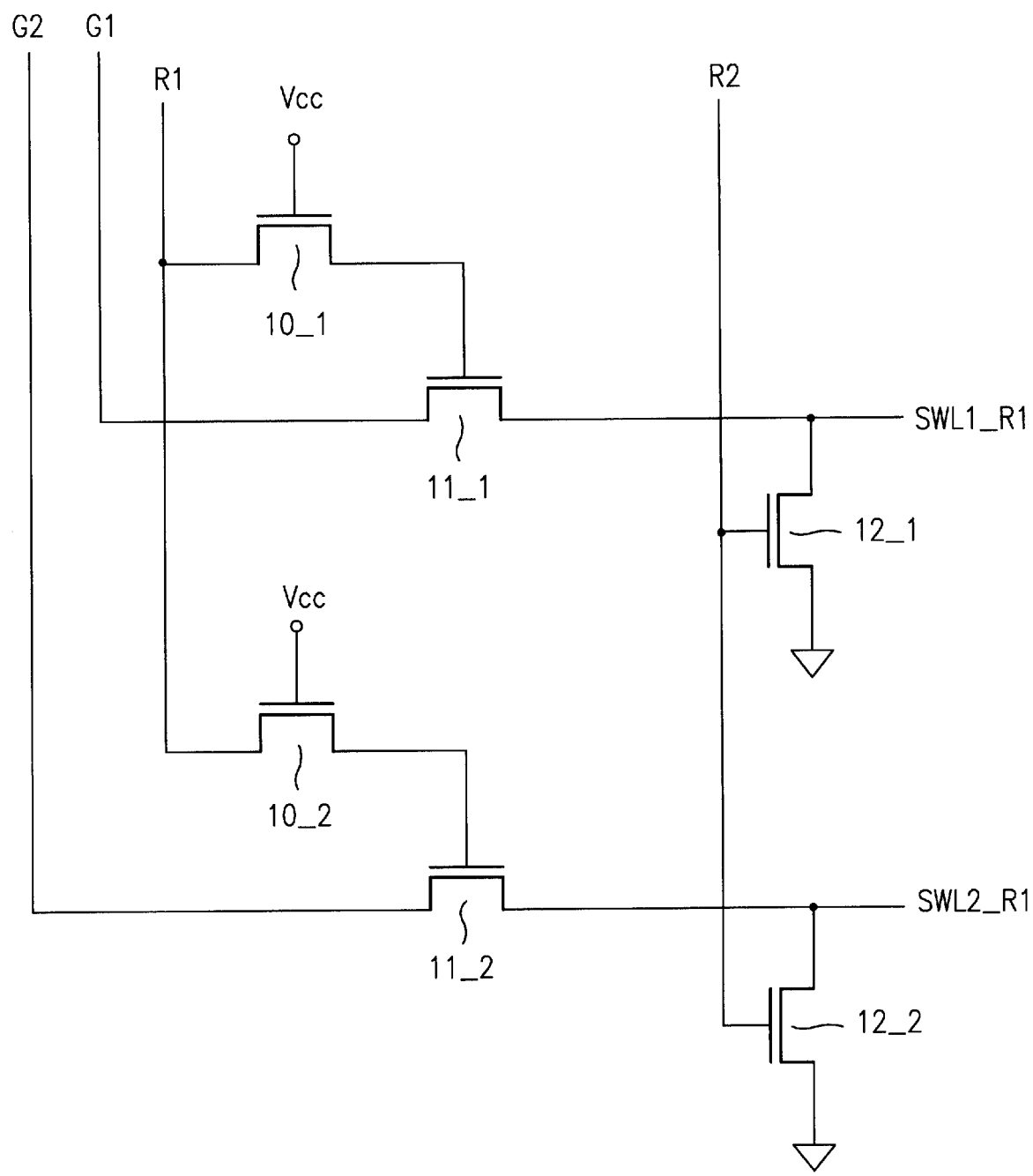
FIG. 10B is a diagram that illustrates additional detail of the nonvolatile ferroelectric memory of FIG. 9 according to the present invention.

FIG. 10B is a diagram that illustrates a local wordline driver when selected control signals (e.g., the R1 and R2) are enabled. FIG. 10B, the local wordline driver includes first switching devices 10_1 and 10_2 for switching the first control signal R1 from the main wordline driver for enabling the local wordline driver, second switching devices 11_1 and 11_2 controlled by the first control signal R1 received through the first switching devices 10_1 and 10_2 for selective switching of the signals G1 and G2 from the local X decoder, and third switching devices 12_1 and 12_2 controlled by the second control signal R2 for providing signals G1 and G2 from the local X decoder received through the second switching devices 11_1 and 11_2 to the first split wordline SWL1_R1 and the second split wordline SWL2_R1. All the first, second and third switching devices are preferably NMOS transistors.

Operations of a local wordline driver shown in FIG. 10B will now be described. When enabled, the first control signal R1 is at a high level, and the second control signal R2 is at a low level. When disabled, the first control signal R1 is at a low level, and the second control signal R2 is at a high level. If the R2 signal is at a low level in a state the G1 signal among signals from the local X decoder 101 is enabled at a high level and the R1 signal is at a high level, the first split wordline SWL1_R1 is enabled to a high level. The first split wordline SWL1_R1 may be disabled to a low level using, for example, two methods. The first method is when the G1 signal is at a low level in a state the R1 signal is at a high level and the R2 signal is at a low level. The second method is when the first split wordline SWL1_R1 is disabled without any prerequisite conditions (e.g., regardless of the G1 signal) in a state the R1 signal is at a low level and the R2 signal is at a high level. If the R2 signal is at a low level in a state the G2 signal of the signals from the local X decoder 101 enabled is at a high level and the R1 signal is at a high level, the second split wordline SWL2_R1 is enabled to a high level. The second split wordline may be disabled in two methods. The first method is when the G2 signal is at a low level in a state the R1 signal is at a high level and the R2 signal is at a low level. The second method is when the second split wordline is disabled without any prerequisite conditions (e.g., regardless of the G2 signal) in a state the R1 signal is at a low level and the R2 signal is at a high level.

Operations for selection of the cell array units by R1 and R2 will now be described with reference to FIG. 9 and FIG. 10B. Even if the G1 and G2 signals from the local X decoder 101 are commonly provided to the first local wordline driver unit 95 and the second local wordline driver unit 97, either one of the first and second local wordline driver units 95 and 97 can be selected according to the first, second, third and fourth control signals. As described above, the first and second control signals from the main wordline driver 91 are enable signals for enabling one of the first and second local wordline drivers 95 and 97, and the third and fourth control signals are signals for disabling the other one. Therefore, if the R1 and R2 signals are the first and second control signals, the second local wordline driver unit is selected. For example, when it is intended to select any one unit cell in the second cell array unit 99, the R1 and R2 are brought into an enabled state and the L1 and L2 are brought into a disabled state. That is, the L1 signal should be brought to a low level, and the L2 signal should be brought to a high level while the R1 signal is at a high level and the R2 signal is at a low level.

Figure 11:
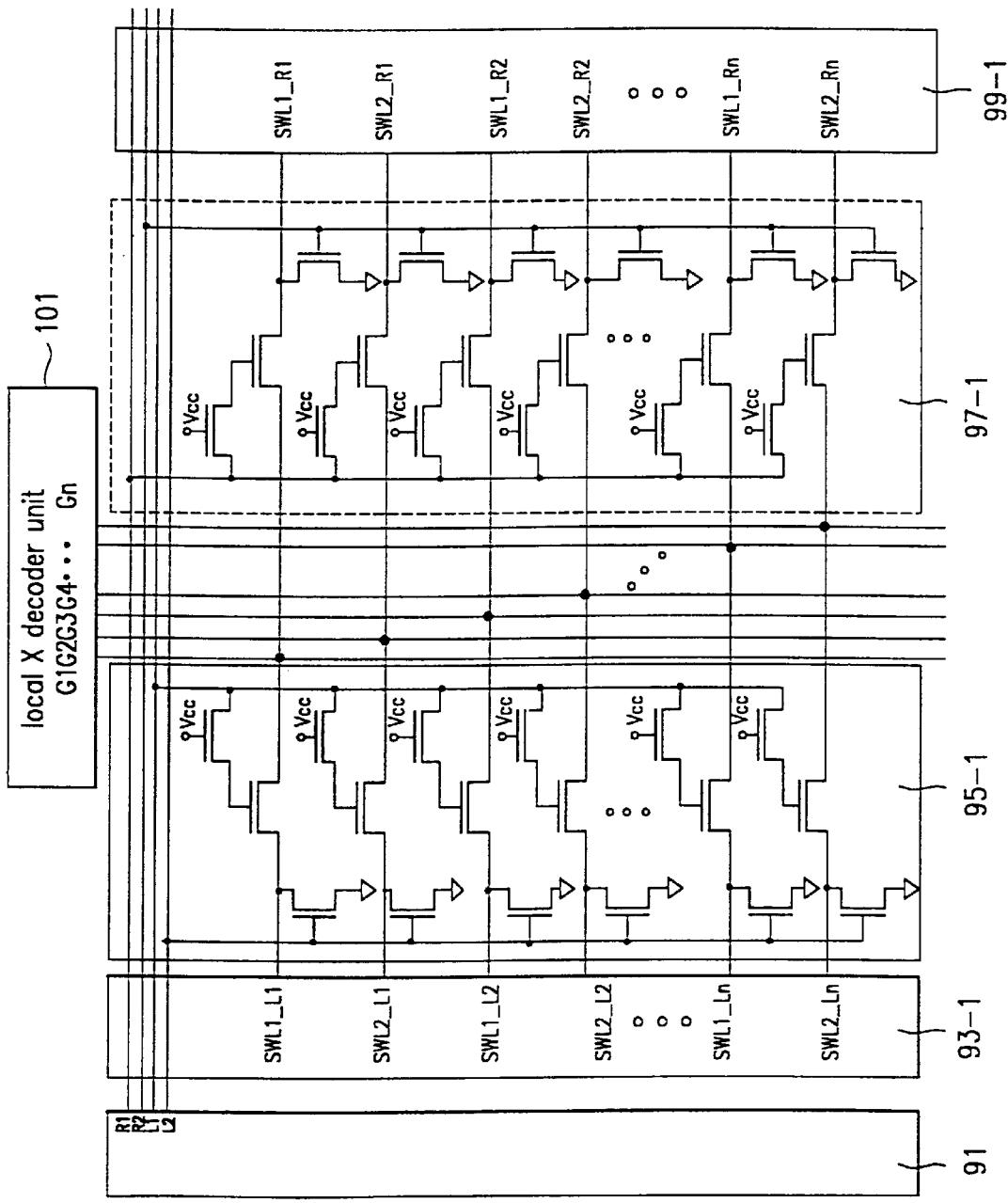
FIG. 11 is a diagram that illustrates additional detail of a driving circuit in each of blocks in FIG. 9.

FIG. 11 is a diagram that illustrates only ones of the plurality of cell arrays (e.g., 93_1, 93_2, 93_3, . . . , 93n and 99_1, 99_2, . . . , 99_n) and the plurality of local wordline drivers (e.g., 95_1, 95_2, 95_3, . . . , 95n and 97_1, 97_2, . . . , 97n) in the first and second cell array units and the first and second local wordline driver units according to preferred embodiments. Therefore, it can be known that a nonvolatile ferroelectric memory according to the first preferred embodiment is provided with a plurality of cell arrays and local wordline drivers as shown in FIG. 11 to preferably form the cell array units and the local wordline driver units.

Figure 12:
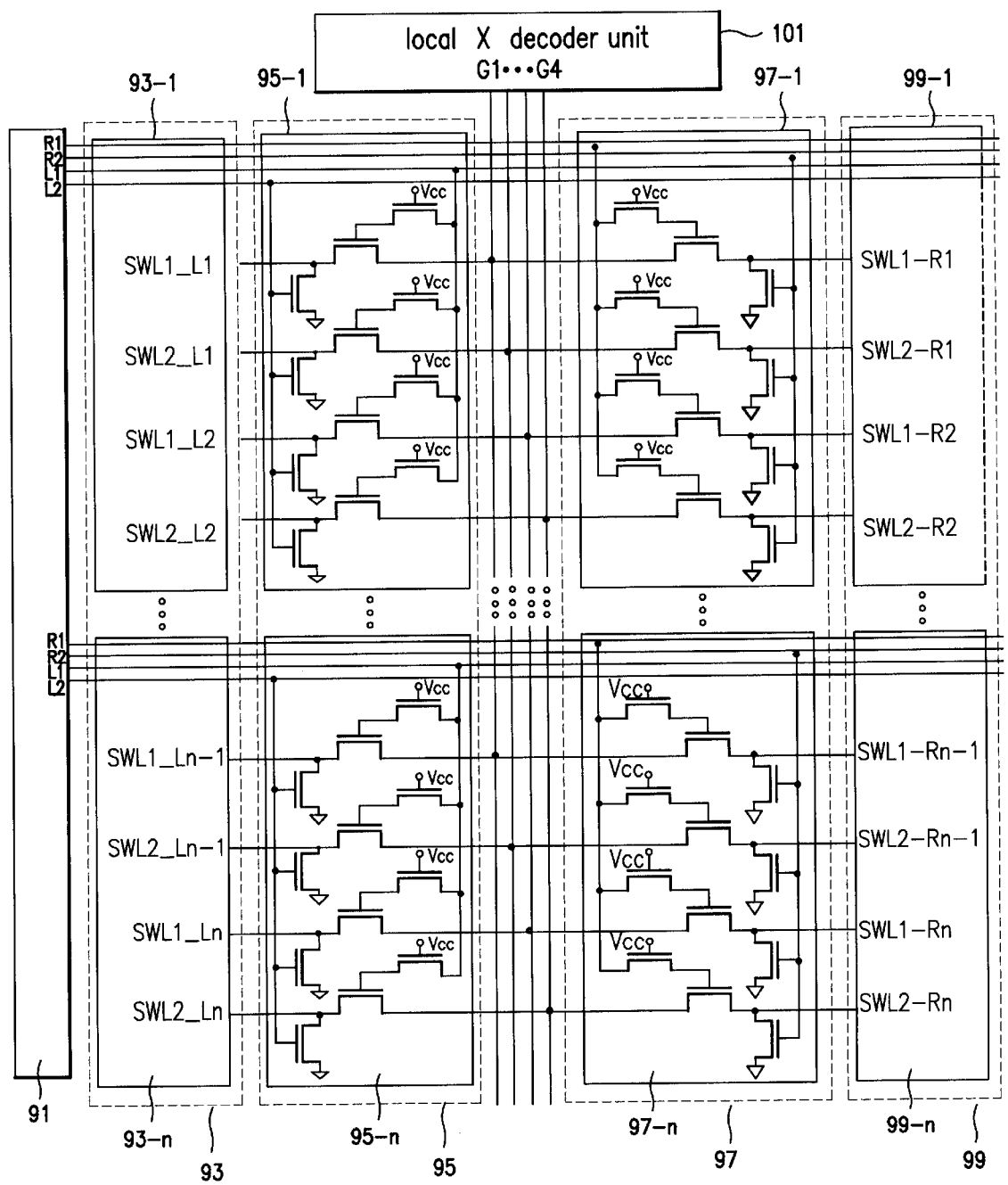
FIG. 12 is a diagram that illustrates a preferred embodiment of a driving circuit the nonvolatile ferroelectric memory in accordance with the present invention.

A first preferred embodiment of a circuit for driving the nonvolatile ferroelectric memory in accordance with the present invention will now be described. FIG. 12 is a diagram that illustrates a circuit for driving the nonvolatile ferroelectric memory in accordance with a first preferred embodiment of the present invention when each cell array is coupled to two pairs of split wordlines.

As shown in FIG. 12, the first preferred embodiment of the circuit for driving the nonvolatile ferroelectric memory in accordance with the present invention includes a first cell array 93 having a plurality of cell arrays 93_1, 93_2, - - - , 93_n, a second cell array unit 99 having a plurality of cell arrays 99_1, 99_2, - - - , 99_n and a first local wordline driver unit 95 formed on one side of the first cell array unit 93 having a plurality of local wordline drivers 95_1, 95_2, - - - , 95_n in correspondence to each cell array in the first cell array unit 93. A second local wordline driver unit 97 has a plurality of local wordline drivers 97_1, 97_2, - - - , 97_n in correspondence to each cell array in the second cell array unit 99 formed on one side of the first local wordline driver unit 95. A main wordline driver unit 91 provides an enable signal for enabling any one of the plurality of local wordline drivers in the first local wordline driver unit 95 and the second local wordline driver unit 97 and a disabling signal for disabling the rest of the local wordline drivers. A local X decoder unit 101 provides an enable signal to both the first and second local wordline driver units 95 and 97 and therefrom to a relevant split wordline through an enabled local wordline driver.

Operations of the first preferred embodiment of the circuit for driving the nonvolatile ferroelectric memory in accordance with the present invention will now be described. In order to select any one cell in the plurality of cell arrays in the first and second cell array units 93 and 99, a local wordline driver coupled to a relevant cell should be selected. Accordingly, the main wordline driver unit 91 provides the first, second, third and fourth control signals for enabling the local wordline driver coupled to the cell, which is intended for selection. For example, as shown in FIG. 12, to enable the second split wordline pair SWL1_L2 and SWL2_L2 in the first cell array 93_1 in the first cell array unit 93, the main wordline driver unit 91 provides the first control signal L1 at a high level and the second control signal L2 at a low level and the third control signal R1 at a low level or the fourth control signal R2 at a high level, which disables the second local wordline driver unit 97 as described above. The first local wordline driver 95_1 in the first local wordline driver unit 95 is enabled by the first and second control signals from the main wordline driver 91. In this instance, the rest of the local wordline drivers 95_2, 95_3, - - - , 95n except the first local wordline driver 95_1 are disabled. Since the first switching devices 10_1, 10_2, 10_3, 10_4 in the first local wordline driver 95_1 are always held turned on by the power source voltage Vcc, the first control signal L1 at a high level is provided to gates of the second switching devices 11_1, 11_2, 11_3 and 11_4 through the first switching devices. Accordingly, all the second switching devices 11_1, 11_2, 11_3 and 11_4 are turned on, and all the third switching devices 12-1, 12-2, 12-3 and 12-4 are turned off by the second control signal L2.

The local X decoder unit 101 provides G1~Gn signals, which are provided to both the first local wordline driver unit 95 and the second local wordline driver unit 97. Since the first local wordline driver 95_1 in the first local wordline driver unit 95 is in an enabled state, G1 and G2 signals are provided to the first split wordline pair SWL1_L1 and SWL2_L1 for the cell array 93_1 coupled to the local wordline driver 95_1, and G3 and G4 are provided to the second split wordline pair. That is, the G1 signal from the local X decoder 101 is provided to the first split wordline SWL1_L1 through the first switching device 11_1 among the second switching devices, and the G2 signal is provided to the second split wordline SWL2_L1 through second switching device 11_2 among the second switching devices. The G3 signal from the local X decoder 101 is provided to the first split wordline SWL1_L2 through the third switching device 11_3 among the second switching devices 11_1, 11_2, 11_3 and 11_4, and the G4 signal is provided to the second split wordline SWL2_L2 through the fourth switching device 11_4. In this instance, since the local X decoder unit 101 provides only the G3 and G4 signals as enable signals among G1~Gn signals while the rest of the signals are provided as disable signals, the first split wordline pair SWL1_L1 and SWL2_L1 is disabled. In contrast, the G3 and G4 signals are provided as enable signals to the second split wordline pair SWL1_L2 and SWL2_L2. Thus, only the second split wordline pair SWL1_L2 and SWL2_L2 are brought into an enabled state. In the meantime, though the G3 and G4 signals are also provided to the first local wordline driver 97_1 in the second local wordline driver unit 97, the G3 and G4 signals are not provided to the first cell array 99_1 in the second cell array 99 because the local wordline driver 97_1 is in a disabled state. Thus, even if the first local wordline driver 95_1 is in an enabled state, the enable signal is provided only to the split wordline pair of a cell intended to select, and the disable signal is provided to rest of the split wordline pairs.

Figure 13:
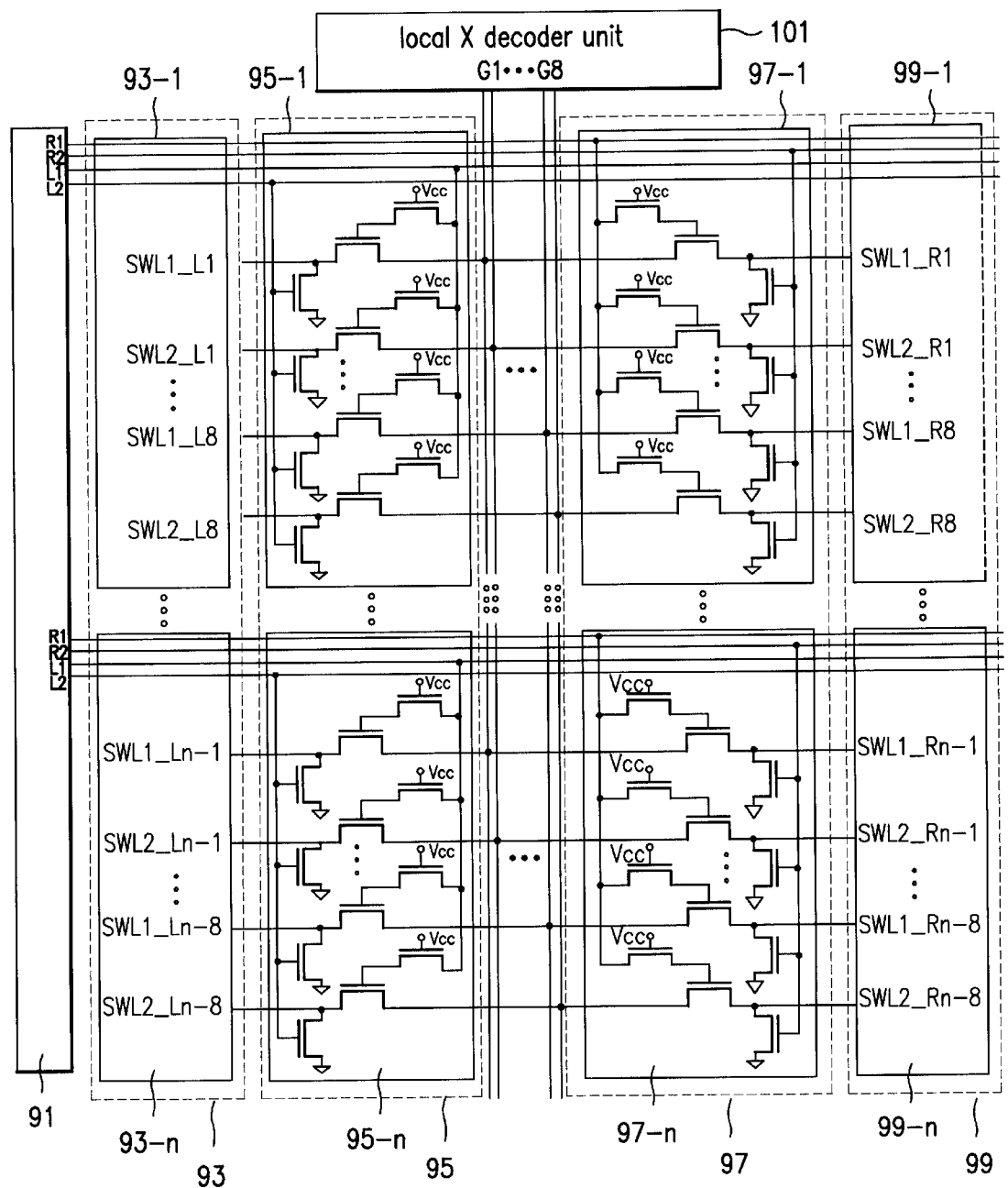
FIG. 13 is a diagram that illustrates another preferred embodiment of a driving circuit the nonvolatile ferroelectric memory in accordance with the present invention.

FIG. 13 is a diagram that illustrates a second preferred embodiment of a driving circuit for the nonvolatile ferroelectric memory in accordance with present invention. The second preferred embodiment of the cell array in FIG. 12 has two pairs of split wordlines, and the preferred embodiment of the cell array in FIG. 13 has four pairs of split wordlines. As described above, a number of switching devices in the local wordline driver is varied with a number of pairs of the split wordlines in accordance with the preferred embodiments. As shown in FIGS. 10A, 10B, 12 and 13, if the number of the split wordline pairs is N (N=1, 2, 3, - - - ) a number of the control signals from the local X decoder unit 101 is preferably 2N.

As described above, preferred embodiments of the driving circuit for a nonvolatile ferroelectric memory and method for operating same according to the present invention have various advantages. The selection of either one of the left and right side cell array units by the control signal from the main wordline driver, which allows provision of only one local decoder unit, can reduce or minimize a chip size because an area occupied by the local decoder unit can be reduced or minimized. Further, a driving capability of the driving circuit in comparison to the chip area allows for a fast access. Local wordline drivers that control the split wordlines can be provided using only NMOS transistors, which can obtain a transmission characteristics having no Vtn drop.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:
    a first memory array and a second memory array each having a plurality of cell arrays;
    a first local wordline driver unit having a first plurality of local wordline drivers on one side of the first memory array that provides driving signals for cells in the first memory array;
    a second local wordline driver unit having a second plurality of local wordline drivers on one side of the first local wordline driver unit that provides driving signals for cells in the second memory array;
    a main wordline driver that provides a control signal to enable one of the first local wordline driver unit and the second local wordline driver unit; and
    a decoder that provides the driving signals to the first and second local wordline driver units for selected cells in the first and second memory arrays, wherein the driving signals are provided to first and second split wordline pairs extending along one direction to cross the first and second memory arrays.

2. The memory device of claim 1, wherein a cell comprises:
    a first and a second split wordlines extending along one direction at first intervals;
    a first and a second bitlines extending along a second direction to cross the first and second split wordlines at second intervals;
    a first transistor having a second electrode coupled to the first bitline and a control electrode coupled to the first split wordline;
    a first ferroelectric capacitor between a first electrode of the first transistor and the second split wordline;
    a second transistor having a second electrode coupled to the second bitline and a control electrode coupled to the second split wordline; and
    a second ferroelectric capacitor between a first electrode of the second transistor and the first split wordline.

3. The memory device of claim 1, wherein the main wordline driver provides a first and a second control signals to enable one of the first and second local wordline drivers, and a third and a fourth control signals to disable the other one of the first and second local wordline drivers.

4. The memory device of claim 3, wherein when the first and second control signals are provided to the first local wordline driver unit, the third and fourth control signals are provided to the second local wordline driver unit, wherein when the first and second control signals are provided to the second local wordline driver unit, the third and fourth control signals are provided to the first local wordline driver unit, and wherein the first and second control signals have opposite phases.

5. The memory device of claim 3, wherein each of the plurality of local wordline drivers comprises:
    first switches that switch the first control signal among enable signals from the main wordline driver;

second switches controlled by the first control signal passed through the first switches that switch a driving signal from the decoder; and third switches controlled by the second control signal among the enable signals that selectively provide the driving signals to a corresponding split wordline.

6. The memory device of claim 5, wherein the switches are NMOS transistors.

7. The memory device of claim 1, wherein each of the plurality of local wordline drivers in the first and second local wordline driver units provides a driving signal to one of a plurality of split wordline pairs.

8. A nonvolatile ferroelectric memory, comprising:

a first cell array and a second cell array each having a plurality of cell subarrays, each cell subarray including 'n' number of split wordline pairs in a first direction, 'm' number of bitlines in a second direction that cross the split wordline pairs, and a cell having a transistor and a ferroelectric capacitor where each bitline crosses each split wordline pair, wherein 'n' and 'm' are positive integers;

a first local wordline driver circuit adjacent the first cell array unit that provides a driving signal to drive one pair of the 'n' number of split wordline pairs;

a second local wordline driver circuit adjacent the first local wordline driver circuit that provides the driving signal to drive any one pair of the 'n' number of split wordline pairs in the second cell array;

a main wordline driver that provides a control signal to enable one of the first local wordline driver circuit and the second wordline driver circuit and disable the other one of the first local wordline driver circuit and the second wordline driver circuit; and a local decoder that provides driving signals for the 'n' number of split wordline pairs to both the first and second local wordline driver for driving selected cells.

9. The nonvolatile ferroelectric memory of claim 8, wherein the cell comprises a first and a second split wordlines extending along one direction at first intervals;

a first and a second bitlines extending along a second direction to cross the first and second split wordlines at second intervals;

a first transistor having a second electrode coupled to the first bitline and a control electrode coupled to the first split wordline;

a first ferroelectric capacitor between a first electrode of the first transistor and the second split wordline;

a second transistor having a second electrode coupled to the second bitline and a control electrode coupled to the second split wordline; and a second ferroelectric capacitor between a first electrode of the second transistor and the first split wordline.

10. The nonvolatile ferroelectric memory of claim 8, wherein there are a '2n' number of the driving signals provided from the local decoder.

11. The nonvolatile ferroelectric memory of claim 8, wherein each of the first and second local wordline driver circuits includes a plurality of local wordline drivers in correspondence to the cell subarrays.

12. The nonvolatile ferroelectric memory of claim 8, wherein the main wordline driver provides a first and a second control signals that enables one of the first and second local wordline driver circuits, and a third and a fourth control signals that disable the other one of the first and second local wordline driver circuits.

13. The nonvolatile ferroelectric memory of claim 12, wherein the first and second control signals have opposite phases.

14. The nonvolatile ferroelectric memory of claim 12, wherein when the first and second control signals are provided to the first local wordline driver circuit, the third and fourth control signals are provided to the second local wordline driver circuit, and wherein when the first and second control signals are provided to the second local wordline driver circuit, the third and fourth control signals are provided to the first local wordline driver circuit.

15. The nonvolatile ferroelectric memory of claim 12, wherein each of the first and second local wordline driver circuits receiving the first and second control signals comprises:

first switches corresponding to the split wordline pairs that switch the first control signal among enable signals from the main wordline driver;

second switches controlled by the first control signal passed through the first switches that switch a driving signal from the decoder; and third switches controlled by the second control signal among the enable signals that selectively provide the driving signals to a corresponding split wordline.

16. A driving circuit for a memory device, comprising:

main wordline driver outputting a plurality of control signals;

a local decoder outputting a plurality of driving signals; and a plurality of local wordline drivers, wherein each of the local wordline drivers comprises, a plurality of first switches, a plurality of second switches to a corresponding one of the first switches, and a plurality of third switches coupled to a corresponding one of the second switches, wherein said each of the local wordline drivers drives a corresponding split wordline pair responsive to the plurality of control signals and the plurality of driving signals.

17. The driving circuit of claim 16, wherein said each of the local wordline drivers drive the split wordline pair to select a memory cell in a memory cell array, wherein each cell comprises:

a first and a second split wordlines extending along one direction at first intervals;

a first and a second bitlines extending along a second direction to cross the first and second split wordlines at second intervals;

a first transistor having a second electrode coupled to the first bitline and a control electrode coupled to the first split wordline;

a first ferroelectric capacitor between a first electrode of the first transistor and the second split wordline;

a second transistor having a second electrode coupled to the second bitline and a control electrode coupled to the second split wordline; and a second ferroelectric capacitor between a first electrode of the second transistor and the first split wordline.

18. A memory device, comprising:

a first memory array and a second memory array each having a plurality of cell arrays;

a first local wordline driver unit having a first plurality of local wordline drivers on one side of the first memory array that provides driving signals for cells in the first memory array;

a second local wordline driver unit having a second plurality of local wordline drivers on one side of the first local wordline driver unit that provides driving signals for cells in the second memory array;

a main wordline driver that provides a control signal to enable one of the first local wordline driver unit and the second local wordline driver unit; and a decoder that provides the driving signals to the first and second local wordline driver units for selected cells in the first and second memory arrays, wherein the main wordline driver provides a first and a second control signals to enable one of the first and second local wordline drivers, and a third and a fourth control signals to disable the other one of the first and second local wordline drivers.

* * * * *